United States Patent
Lin et al.

(10) Patent No.: US 10,522,619 B2
(45) Date of Patent: Dec. 31, 2019

(54) THREE-DIMENSIONAL TRANSISTOR

(71) Applicants: Semiconductor Manufacturing International (Beijing) Corporation, Beijing (CN); Semiconductor Manufacturing International (Shanghai) Corporation, Shanghai (CN)

(72) Inventors: Xinyuan Lin, Tianjin (CN); Ying Jin, Tianjin (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/707,359

(22) Filed: Sep. 18, 2017

(65) Prior Publication Data
US 2018/0006112 A1    Jan. 4, 2018

Related U.S. Application Data

(62) Division of application No. 15/224,140, filed on Jul. 29, 2016, now Pat. No. 9,799,728.

(30) Foreign Application Priority Data

Aug. 25, 2015  (CN) .......................... 2015 1 0526717

(51) Int. Cl.
*H01L 29/06*    (2006.01)
*H01L 29/78*    (2006.01)
(Continued)

(52) U.S. Cl.
CPC .... *H01L 29/0653* (2013.01); *H01L 21/76232* (2013.01); *H01L 29/6681* (2013.01);
(Continued)

(58) Field of Classification Search
None
See application file for complete search history.

(56) References Cited

U.S. PATENT DOCUMENTS 7,217,623 B2    5/2007  Kim et al.
7,425,740 B2 *  9/2008  Liu .................. H01L 27/10897
                                                                257/306
(Continued)

FOREIGN PATENT DOCUMENTS

CN           1812112 A       8/2006
KR         100806610 B1      2/2008

*Primary Examiner* — Chandra Chaudhari
(74) *Attorney, Agent, or Firm* — Anova Law Group, PLLC

(57) ABSTRACT

The disclosed subject matter provides a method for fabricating a three-dimensional transistor. The method includes forming an active region and two isolation structures on a semiconductor substrate. The active region is formed between the two isolation structures. The method further includes forming a photoresist layer on the active region and the isolation structures, forming an opening in the photoresist layer to expose a top surface of the active region and a portion of a top surface of each isolation structure, and then forming a trench on each side of the active region by removing a portion of the corresponding isolation structure exposed in the opening through an etching process using the photoresist layer as an etch mask. After the etching process, the portion of the active region between the two trenches becomes a three-dimensional fin structure. The disclosed method simplifies fabrication process for three-dimensional transistors and reduces product cost.

9 Claims, 6 Drawing Sheets

(51) Int. Cl.
*H01L 21/762* (2006.01)
*H01L 29/66* (2006.01)

(52) U.S. Cl.
CPC ...... *H01L 29/66795* (2013.01); *H01L 29/785* (2013.01); *H01L 29/7853* (2013.01)

(56) References Cited

U.S. PATENT DOCUMENTS

| | | | | |
|---|---|---|---|---|
| 7,655,533 | B2 * | 2/2010 | Sheen | H01L 29/66795 257/E21.56 |
| 8,048,723 | B2 | 11/2011 | Chang et al. | |
| 8,609,480 | B2 | 12/2013 | Xie | |
| 2006/0081887 | A1 * | 4/2006 | Lyu | H01L 27/14603 257/215 |
| 2014/0357061 | A1 * | 12/2014 | Kim | H01L 29/66795 438/479 |

* cited by examiner

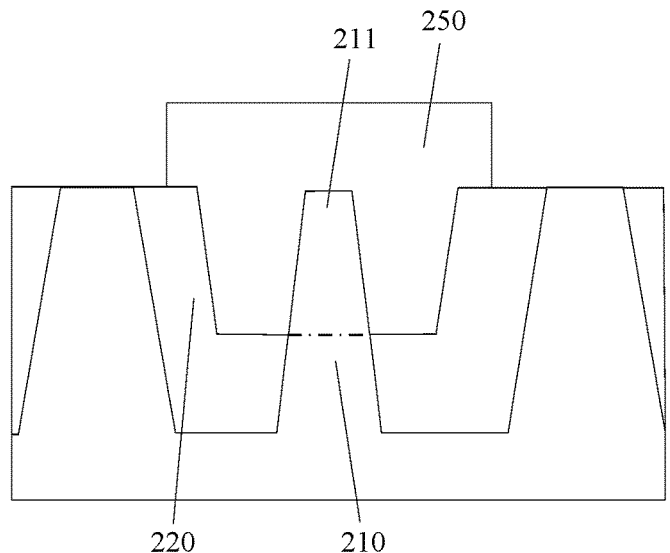

FIG. 9

| | |
|---|---|
| Providing a semiconductor substrate with an active region and two isolation structures formed on the semiconductor substrate, wherein the two isolation structures are located on the two sides of the active region | S101 |
| Forming a photoresist layer on the active region and the two isolation structures | S102 |
| Forming an opening in the photoresist layer to expose the active region and a portion of the top of each isolation structure | S103 |
| Forming a trench on each side of the active region by removing a portion of the corresponding isolation structure through a wet etching process using the photoresist layer as an etch mask, wherein a fin structure is also simultaneously formed between the two trenches | S104 |
| Removing the photoresist layer, forming a gate dielectric layer on the fin structure, and then forming a gate electrode by using a gate material to fill the trenches | S105 |

FIG. 10

THREE-DIMENSIONAL TRANSISTOR

CROSS REFERENCE TO RELATED APPLICATIONS

This application is a divisional of U.S. patent application Ser. No. 15/224,140, filed on Jul. 29, 2016, which claims the priority of Chinese Patent Application No. CN201510526717.4, filed on Aug. 25, 2015, the entire content of all of which is incorporated herein by reference.

FIELD OF THE DISCLOSURE

The present disclosure generally relates to the field of semiconductor fabrication technology and, more particularly, relates to a three-dimensional transistor and fabrication methods thereof.

BACKGROUND

In a metal-oxide-semiconductor (MOS) transistor, the switching signal is generated by manipulating the current flow in channel region through applying a gate voltage on the gate electrode. As the feature size (or critical dimension, CD) of semiconductor devices becomes smaller, the degree of integration of semiconductor chips continuously increases. The ability of traditional planar MOS transistor to control channel current becomes insufficient, which leads to considerably large leakage current. That is, the so-called short-channel effects (SCE) become more severe in the traditional planar MOS transistor. Therefore, traditional planar MOS transistors are gradually replaced by transistors with a three-dimensional (3D) device structure, i.e., 3D transistors. A 3D transistor includes a variety of forms such as fin field effect transistor (FinFET). Compared to a traditional planar transistor, besides having a much lower leakage current (i.e. the SCE is suppressed), a 3D transistor also demonstrates many other advanced properties, such as better drive ability, and better anti-noise performance, etc.

Currently, the fabrication methods for 3D transistors often require using advanced tools with better capability and better performance. Such advanced tools usually need to be specially designed and reformed. Therefore, the fabrication cost for existing methods may be very high. The disclosed fabrication methods and 3D transistors are directed to solve one or more problems set forth above and other problems in the art.

BRIEF SUMMARY OF THE DISCLOSURE

One aspect of the present disclosure includes a method for fabricating a three-dimensional transistor. The method includes providing a semiconductor substrate and forming an active region and two isolation structures on the semiconductor substrate. The active region is formed between the two isolation structures. The method further includes forming a photoresist layer on the active region and the isolation structures, forming an opening in the photoresist layer to expose a top surface of the active region and a first portion of a top surface of each isolation structure, and then forming a trench on each side of the active region by removing a portion of the corresponding isolation structure exposed in the opening through an etching process performed along the opening using the photoresist layer as an etch mask. The method also includes removing the photoresist layer after the etching process. The portion of the active region between the two trenches becomes a three-dimensional fin structure.

Another aspect of the present disclosure provides another method for fabricating a three-dimensional transistor. The method includes providing a semiconductor substrate and forming an active region and two isolation structures on the semiconductor substrate. The active region is formed between the two isolation structures. The method further includes forming a first photoresist layer on the active region and the isolation structures and forming a first opening in the first photoresist layer on each isolation structure to expose a first portion of a top surface of the isolation structure. After forming the first opening, the first photoresist layer still covers the active region and a portion of each isolation structure close to the active region. The method also includes forming a first trench in each isolation structure by removing a portion of the isolation structure exposed in the corresponding first opening through an etching process performed along the first opening using the first photoresist layer as an etch mask. After etching, the remaining portion of each isolation structure between the corresponding first trench and the active region becomes a residual structure. The method further includes removing the first photoresist layer and forming a second photoresist layer on the active region and the isolation structures with the second photoresist layer filling up the first trenches. The method also includes forming a second opening in the second photoresist layer to expose a top surface of the active region, a top surface of each residual structure, and a portion of each first trench near the corresponding residual structure. Moreover, the method includes forming a second trench on each side of the active region by removing a portion of the isolation structure exposed in the corresponding second opening through an etching process performed along the second opening by using the second photoresist layer as an etch mask, and then removing the second photoresist layer. The portion of the active region exposed by the two second trenches becomes a three-dimensional fin structure.

Another aspect of the present disclosure provides a three-dimensional transistor. The three-dimensional transistor includes an active region and two isolation structures formed on a semiconductor substrate. The active region is formed between the two isolation structures. The transistor further includes two trenches formed in the two isolation structures on both sides of the active region. The portion of the active region exposed by the two trenches is a three-dimensional fin structure. Moreover, the transistor also includes a gate dielectric layer formed on a surface of the fin structure and a gate electrode formed on the gate dielectric layer and filling up the trenches on both sides of the fin structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIGS. 4-9 illustrate schematic views of semiconductor structures corresponding to certain stages of another exemplary fabrication method consistent with disclosed embodiments;

FIG. 10 illustrates a flowchart of an exemplary fabrication process consistent with disclosed embodiments.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
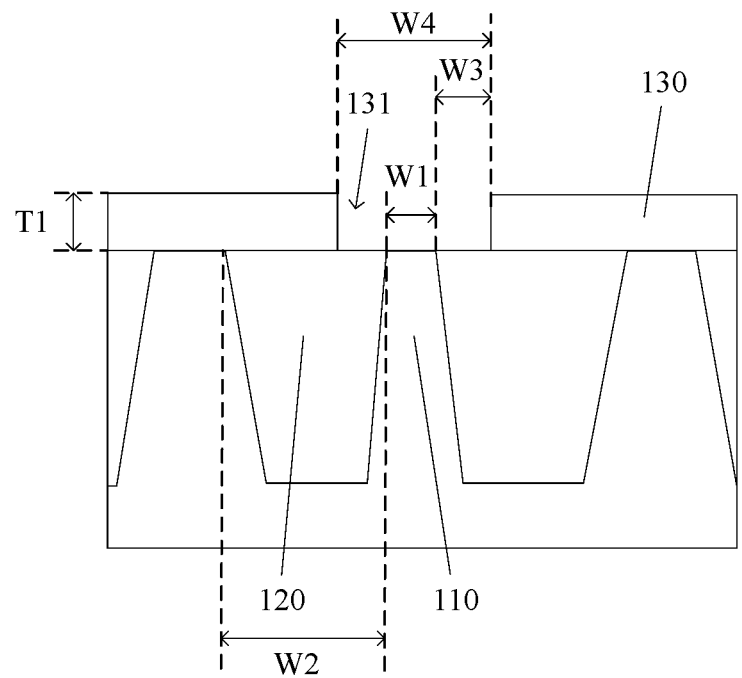
FIGS. 1-3 illustrate schematic views of semiconductor structures corresponding to certain stages of an exemplary fabrication method consistent with various disclosed embodiments.
Figure 2:
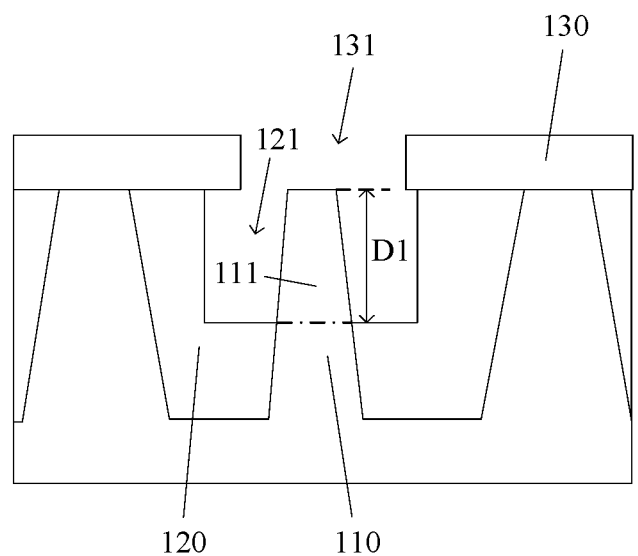
Figure 3:
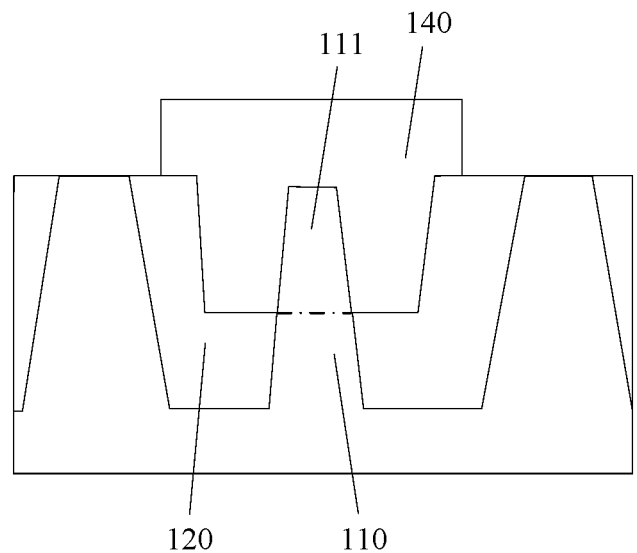

FIG. 10 shows a flowchart of an exemplary fabrication process consistent with various disclosed embodiments. FIGS. 1-3 show schematic views of semiconductor structures corresponding to certain stages of the exemplary fabrication method illustrated in FIG. 10. In one embodiment, the semiconductor structure is described to have one 3D transistor formed on the semiconductor substrate. In other embodiments, the number of 3D transistors formed on the semiconductor substrate may be more than one.

Referring to FIG. 10, at the beginning of the fabrication process, two isolation structures and an active region may be formed on a semiconductor substrate (S101). FIG. 1 shows a schematic cross-section view of the semiconductor substrate.

Referring to FIG. 1, a semiconductor substrate (not labeled) is provided. An active region 110 and two isolation structures 120 may be formed on the semiconductor substrate. The two isolation structures 120 may be formed separately on the two sides of the active region 110.

In one embodiment, the semiconductor substrate is made of Si. In certain other embodiments, the semiconductor substrate may be made of any appropriate semiconductor material such as SiGe, III-V group compounds, SiC or multiple-layer structure based on SiC, silicon on insulator, etc.

In one embodiment, the isolation structures 120 may be shallow trench isolation (STI) structures. The active region 110 and the STI structures formed on the two sides of the active region 110 may be fabricated through a method including forming two shallow trenches (not shown) in the semiconductor substrate by a dry etching process, and then back filling the trenches with an isolation material. Specifically, a high aspect ratio process (HARP), a high density plasma (HDP) process, or a chemical vapor deposition (CVD) process may be performed to fill the shallow trenches.

The fabrication method for the STI structures and the active region 110 may further includes performing a planarization process to form the two STI structures. The planarization process may be a chemical mechanical polishing (CMP) process. As shown in FIG. 1, a portion of the region on the semiconductor substrate located between the two STI trenches may be the corresponding active region 110.

In one embodiment, the isolation structures 120 may not be fabricated by any field oxidation process because of the relatively small feature size. Field oxidation process is usually used to fabricate technology nodes larger than or equal to 0.35 μm. In such cases, the corresponding active region may be relatively wide and the channel area may also be sufficiently large, thus further increasing the channel area by adopting a 3D channel structure may not be required.

In one embodiment, the top width of the active region 110 may be in a range of 0.187 μm to 1.1 μm. The fabrication method used in the present embodiment may be suitable for fabricating relatively small but not extremely small technology nodes. For example, the method may be applicable to the fabrication of technology nodes of 0.18 μm or 0.13 μm. In such a case, during the designing process of the active region 110, the minimum value of the top width of the active region W1 is usually designed as 0.22 μm. During the fabrication of the active region 110 on the semiconductor substrate, a certain percentage of contraction may be allowed. In an extreme case, the actual size of the active region 110 may shrink to be only 85% of the designed value.

Therefore, during the actual fabrication process for the active region 110, the minimum allowed value of the top width of the active region 110 may be 0.187 μm. Based on comprehensive factors determined in the designing process, the maximum value of the top width of the active region 110 may then be determined. Specifically, when the top width of the active region is larger than 1.1 μm, further increasing the top width may not result in a meaningful gain for the device. Therefore, in one embodiment, the maximum value of the top width of the active region 110 is controlled to be lower than 1.1 μm.

In one embodiment, each of the two sidewalls of the active region 110 may have an angle (not labeled) in a range of 85° to 90° with respect to the surface of the semiconductor substrate. That is, the width of the active region 110 becomes larger as moving deeper into the semiconductor substrate. The angle between the surface of the semiconductor substrate and the sidewall of the active region 110 may need to be relatively large. That is, the sidewalls of the active region 110 may need to be relatively steep so that the trench may have an ideal depth to width ratio, which further ensures desired insulation performance for the STI structures.

In one embodiment, the top width of the isolation structure 120 may be in a range of 0.2 μm to 0.4 μm. Because a fin structure may be formed between the two isolation structures 120, the top width W2 of the isolation structures 120 may need to be larger than 0.2 μm in order to avoid a potential problem of current leaking between the formed fin structure and an adjacent active region 110. On the other hand, the top width W2 of the isolation structures 120 may not be too large either. Specifically, during a subsequent process to form a complete transistor, a gate material may be used to fill trenches 121 (referring to FIG. 2) formed in the isolation structures 120. When the top width W2 of the isolation structures 120 is excessively large, the size of the trenches 121 to be filled in the subsequent process may be too large to be completely filled. Therefore, the top width W2 of the isolation structures 120 is pre-designed to be less than 0.4 μm.

Further, returning to FIG. 10, a photoresist layer may be formed on the active region and the two isolation structures (S102).

Referring to FIG. 1, a photoresist layer 130 is formed on the top of the active region 110 and the two isolation structures 120. In a subsequent process, an opening may be formed in the photoresist layer 130 to expose the top surface of the active region 110 and a portion of the top surface of the isolation structures 120 on both sides of the active region 110.

In existing methods for fabricating fin structures, a regular photoresist is usually used and, correspondingly, a hard mask layer is also frequently used. During the fabrication process, the regular photoresist needs to be baked at a temperature below 100° C. That is, a regular photoresist cannot be baked at a temperature higher than 100° C.; otherwise the photoresist layer may be warped and deformed due to excessive loss of water. However, because of the relatively low baking temperature for a regular photoresist, the structural hardness of the formed photoresist layer may be low.

In one embodiment, the photoresist layer 130 is formed by a photoresist material with a baking temperature in a range of 100° C. to 120° C. That is, a photoresist material that can be baked at a temperature in a range of 100° C. to 120° C. may be used to obtain a relatively hard photoresist layer. In addition, the formed photoresist layer 130 may also have desired anti-acid performance and adhesion property. Therefore, the photoresist layer 130 may prevent the sidewalls of a subsequently-formed opening from warping during a subsequent wet etching process and, thus, may ensure that the designed pattern can be accurately transferred onto the top of the isolation structures 120.

In one embodiment, the thickness T1 of the photoresist layer 130 is in a range of 3260 Å to 14000 Å. The actual thickness T1 of the photoresist layer 130 may vary depending on the type of the mask aligner or the exposure system, the type of the photoresist material, the size of the subsequently-formed opening, and/or the depth of subsequently formed trenches 121 (referring to FIG. 2). In one embodiment, taking all or some of the above factors into account, the thickness of the photoresist layer 130 may be controlled to be in a range of 3260 Å to 14000 Å. For example, when a minimum process window is 0.367 μm while the depth of the trenches 121, subsequently formed in the isolation structures 120, is 2200 Å, the thickness T1 of the photoresist layer 130 may be 5500 Å.

Further, returning to FIG. 10, an opening exposing the active region and a portion of the top of the isolation structures on both sides of the active region may then be formed in the photoresist layer (S103).

Referring to FIG. 1, an opening 131 may be formed in the photoresist layer 130. The opening 131 may expose the top of the active region 110. In addition, a first portion (not labeled) of the top of the isolation structures 120 formed on both sides of the active region 110 may also be exposed in the opening 131. A first width W3 may represent the width of the first portion of the top surface of the isolation structure. In one embodiment, the opening 131 is formed in the photoresist layer 130 through a standard exposure and development process.

In one embodiment, the width W4 of the opening 131 may need to be at least larger than the top width W1 of the active region 110. Specifically, the width W4 of the opening 131 may be the total value of the top width of the active region 110 and the top widths of the two isolation structures 120 subtracting the depth of the subsequently-formed trenches 121 (referring to FIG. 2). That is, the width W4 of the opening 131 may be expressed as a sum of the top width W1 of the active region 110 and two first widths W3.

The first width W3 may be in a range of 0.18 μm to 0.36 μm. The first width W3 is an important factor in the disclosed embodiments because the width and the depth of the subsequently-formed trenches 121 are directly related to the first width W3. Therefore, precise control of the first width W3 may be required.

Specifically, on one hand, the size of the first width W3 may be related to the top width W1 of the active region 110 and the top width W2 of the isolation structures 120. On the other hand, the first width W3 may have direct influence on the width of the subsequently-formed trenches 121. Because the trenches 121 are subsequently formed by a wet etching process and the wet etching method may be isotropic, within a same etching period, the depth and the width of the trenches 121 formed in the subsequent process may be larger when the first width W3 is larger. Therefore, once the value of the first width W3 is decided, the width W4 of the opening 131 may also be determined.

In one embodiment, a first width-difference is defined as the width W4 of the opening 131 subtracting the top width W1 of the active region 110. As shown in FIG. 1, the first width may be a half of the first width-difference. That is, the top of the active region is exposed in the center of the opening 131. When the width W4 of the opening 131 reaches a minimum value, the top width of the active region 110 may also take the minimum value, i.e. 0.187 μm. Further, the depth of the subsequently formed trenches 121 (referring to FIG. 2) may be 2200 Å, i.e. 0.22 μm, while a maximum position deviation of the opening 131 along either direction may be 0.2 μm, thus the first width W3 may then be obtained through a formula 0.2+0.2−0.22=0.18 μm.

The value of the first width W3 obtained from the formula ensures that the opening 131 can simultaneously expose the top of the active region 110 and the portion of the top of the two isolation structures 120 located on the two sides of the active region 110. In addition, the value also ensures that the trenches 121, subsequently formed by etching the isolation structures 120 along the opening 131, meet the corresponding requirements. When the width W4 of the opening 131 reaches a maximum value, the corresponding top width W1 of the active region 110 may also take the maximum value, i.e. 1.1 μm. Accordingly, the first width W3 may be about 0.36 μm.

For the above reasons, the first width W3 may be controlled to be in a range of 0.18 μm to 0.36 μm. When the first width W3 is controlled in such a range, a number of potential problems may be avoided. Specifically, (1) difficulties in performing a subsequent wet etching process due to misalignment of the opening 131 may be prevented; (2) because a small first width W3 may result in a very large depth to width ratio for the trenches 121, using a proper value for the first width W3 may avoid challenges in filling the trenches 121 due to a large depth to width ratio of the trenches 121; (3) a proper value of the first width W3 may also prevent a very large size of the subsequently-formed trenches 121 due to an overly large width W4 of the opening, thus may avoid difficulties in a subsequent process to properly fill the trenches 121 using a gate material.

Further, returning to FIG. 10, a trench may be formed on each side of the active region by a wet etching process to remove a portion of the isolation structures using the photoresist layer as an etch mask (S104). FIG. 2 shows a schematic cross-section view of the corresponding semiconductor structure.

Referring to FIG. 2, a wet etching process may be performed along the opening 131 using the photoresist layer 130 as an etch mask to remove a portion of the isolation structures exposed by the opening 131. A trench 121 may then be formed on each side of the active region 110. The portion of the active region 110 exposed by the trenches 121 may then be a fin structure 111. Because the fin structure 111 is a part of the active region 110, in FIG. 2 and FIG. 3, a dash-dotted line is used to schematically separate the fin structure 111 from the active region 110.

In the fabrication process described above, the width W4 of the opening (referring to FIG. 1) may reach a proper value by controlling the value of the first width W3. Therefore, after the portion of the isolation structures 120 exposed in the opening 131 may be removed by the wet etching process along the opening 131, the depth D1 of the trenches 121 may be controlled in a desired range, and the width of the trenches may also meet the requirements. In one embodiment, the depth of the trenches 121 may be controlled in a range of 440 Å to 2200 Å.

The two trenches 121 and the fin structure 111 may be simultaneously formed, thus the depth D1 of the trenches 121 may be equal to the height of the fin structure 111. In one embodiment, the wet etching process may use a buffered oxide etch (BOE) solution. The BOE solution may be a mixed solution of HF and $NH_4F$ with a concentration ratio of 1:6. In certain other embodiments, the wet etching process may also be performed in a HF solution with a relatively slow etch rate.

Returning to FIG. 10, further, the photoresist layer may be removed, a gate dielectric layer may be formed on the top of the fin structure, and a gate electrode may then be formed by filling the trenches with a gate material (S105). FIG. 3 shows a schematic cross-section view of the corresponding semiconductor structure.

Referring to FIG. 3, the photoresist layer 130 is removed. A gate dielectric layer (not shown) may be formed on the surface of the fin structure 111. Further, by using a gate material to fill up the trenches 121 and cover the gate dielectric layer, a gate electrode 140 may be formed. As such, a complete transistor may be formed. The gate material may be polycrystalline silicon.

In one embodiment, besides the above non-planar (i.e. 3D) transistors, the semiconductor substrate may also have planar transistors formed on other regions of the substrate. That is, the disclosed fabrication method may be used to form chips on which only certain transistors are fabricated in a non-planar structure while most of the other transistors are fabricated in a planar form. In such cases, following the disclosed method, non-planar transistors may be fabricated by tools traditionally used for forming planar transistors without introducing extra new advanced tools or using advanced fabrication processes. Therefore, the fabrication process may be simplified and the process cost may be reduced.

According to the disclosed fabrication method for 3D transistor, by improving the process method for large technology nodes, changing the process parameters of tools used for large technology nodes, and adjusting the fabrication size of large technology nodes, 3D transistors may be fabricated. The disclosed method may not require any process method for small technology nodes or any corresponding advanced tool to fabricate 3D transistors. In the meantime, structures such as hard mask may not be required in the disclosed method, thus the fabrication process may be simplified and the process cost may be reduced.

Figure 11:
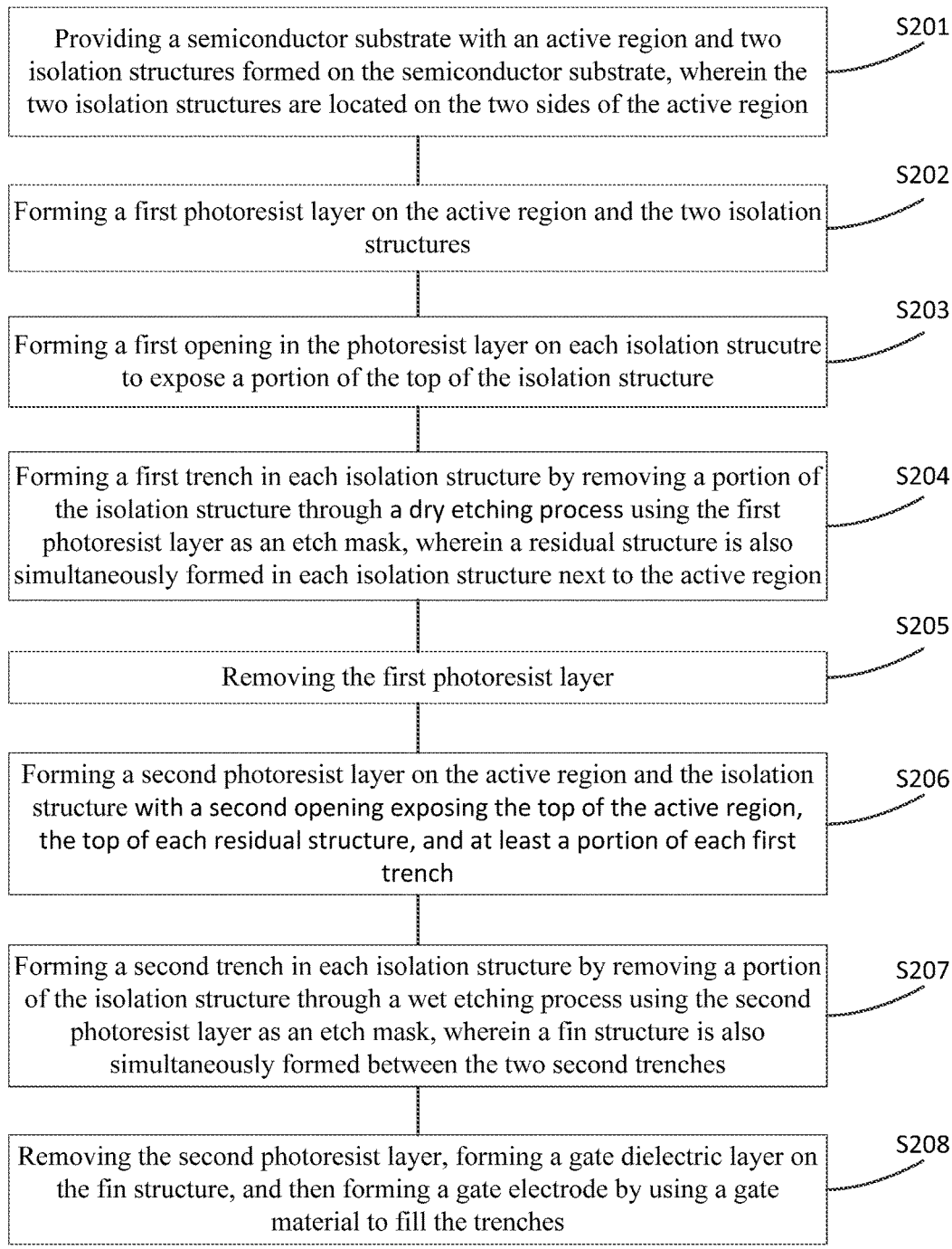
FIG. 11 illustrates a flowchart of another exemplary fabrication process consistent with disclosed embodiments.

FIG. 11 shows a flowchart of another exemplary fabrication process consistent with various disclosed embodiments. FIGS. 4-9 show schematic views of semiconductor structures corresponding to certain stages of the exemplary fabrication method illustrated in FIG. 11.

Figure 4:
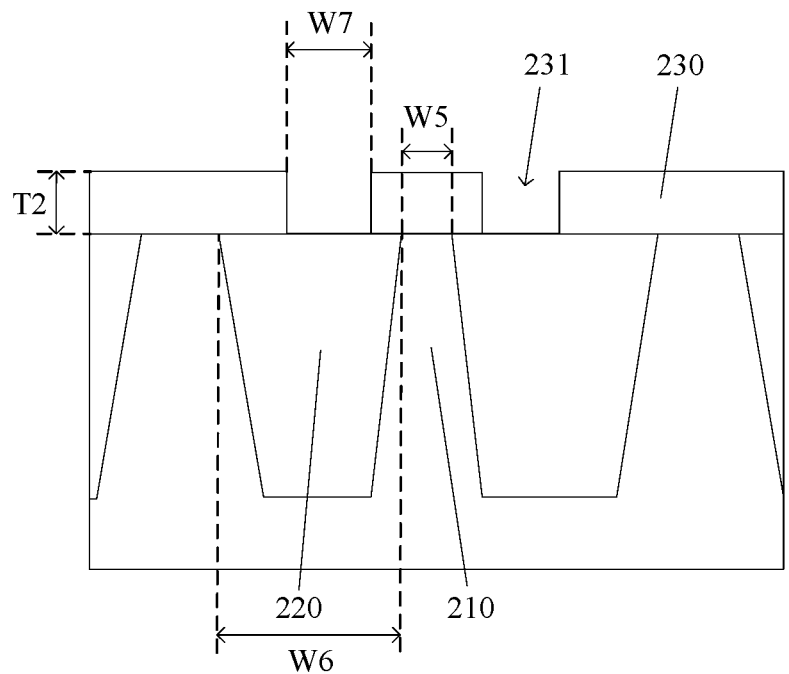

Referring to FIG. 11, two isolation structures separated by an active region may be formed on a semiconductor substrate (S201). FIG. 4 shows a schematic cross-section view of the semiconductor substrate.

Referring to FIG. 4, a semiconductor substrate (not labeled) is provided. An active region 210 and two isolation structures 220 may be formed on the semiconductor substrate. The two isolation structures 220 may be formed separately on the two sides of the active region 210.

In one embodiment, the semiconductor substrate is made of Si. In certain other embodiments, the semiconductor substrate may be made of any appropriate semiconductor material such as SiGe, III-V group compounds, SiC or multiple-layer structure based on SiC, silicon on insulator, etc.

In one embodiment, the isolation structures 220 may be STI structures. The active region 210 and the STI structures formed on the two sides of the active region 210 may be fabricated through a method described above in the previous embodiment. As shown in FIG. 4, a portion of the region on the semiconductor substrate located between the two STI trenches may then be the corresponding active region 210.

In one embodiment, for similar reasons as in the embodiments described above, the isolation structures 220 may not be fabricated by any field oxidation process. The top width of the active region 210 may be in a range of 0.187 μm to 1.1 μm. Each of the two sidewalls of the active region 210 may have an angle (not labeled) in a range of 85° to 90° with respect to the surface of the semiconductor substrate. The top width of the isolation structure 220 may be in a range of 0.2 μm to 0.4 μm. One may refer to the corresponding descriptions in the aforementioned embodiments for more details.

Further, returning to FIG. 11, a first photoresist layer may be formed on the active region and the two isolation structures (S202).

Referring to FIG. 4, a first photoresist layer 230 is formed on the top of the active region 210 and the two isolation structures 220. In a subsequent process, two first openings may be formed in the first photoresist layer 230 to expose a first portion of the top of each isolation structure 220.

In one embodiment, the thickness T2 of the first photoresist layer 230 may be in a range of 3620 Å to 14000 Å. Different from that in the aforementioned embodiments, the first photoresist layer 230 may be made of a regular photoresist material. In the present embodiment, the etching time for a subsequently-performed wet etching process may be nearly about 50% shorter than the etching time in the aforementioned embodiments and, thus, the requirements on the adhesion property and the anti-acid performance of the first photoresist layer 230 may not be as high as that in the aforementioned embodiments. Therefore, in the present embodiment, a regular photoresist material may be used to form the first photoresist layer 230, that is, the baking temperature of the first photoresist layer 230 may be less than 100° C.

The actual thickness T1 of the first photoresist layer 230 may vary depending on the type of the mask aligner or the exposure system, the position deviations of the subsequently-formed first openings, and the depth of subsequently-formed first trenches 221 (referring to FIG. 5). For example, when the maximum position deviation of the subsequently-formed first openings 231 is 0.2 μm while the depth of the first trenches is 2200 Å, the thickness T2 of the first photoresist layer 230 may be 14000 Å. When the top width of the isolation structures 220 takes the maximum value, i.e. 0.4 μm, while the depth of the subsequently-formed first trenches takes the minimum value, i.e. 440 Å, the thickness T2 of the first photoresist layer 230 may reach a minimum value. The minimum value of the thickness T2 of the first photoresist layer 230 may be 3620 Å.

Further, returning to FIG. 11, a first opening may be formed on each isolation structure to expose a portion of the top surface of the isolation structure (S203).

Referring to FIG. 4, a first opening 231 is formed on each of the two isolation structures 220. A first portion of the top of each isolation structure 220 on one side of the active region 210 may be exposed in the corresponding first opening 231.

In one embodiment, the width W7 of the first openings 231 may be designed to be about 0.04 µm to about 0.08 µm shorter than the top width W6 of the isolation structures 220. As described above, each of the sidewalls of the active region 210 may have an angle in a range of 85° to 90° with respect to the surface of the semiconductor substrate. Further, to ensure a desired depth for subsequently-formed first trenches 221 (referring to FIG. 5) and prevent damage to the active region 210 during a subsequent dry etching process, and also based on the limit of yellow light process and the range (i.e., 0.2 µm to 0.4 µm) of the top width of the isolation structures 220, the width W7 of the first openings 231 may be set to be about 0.04 µm to about 0.08 µm shorter than the top width W6 of the isolation structures 220.

Further, returning to FIG. 11, a first trench may be formed in each of the isolation structures through a dry etching process using the first photoresist layer as an etch mask to remove a portion of the isolation structure along the corresponding first opening (S204). FIG. 5 shows a schematic cross-section view of the corresponding semiconductor structure.

Figure 5:
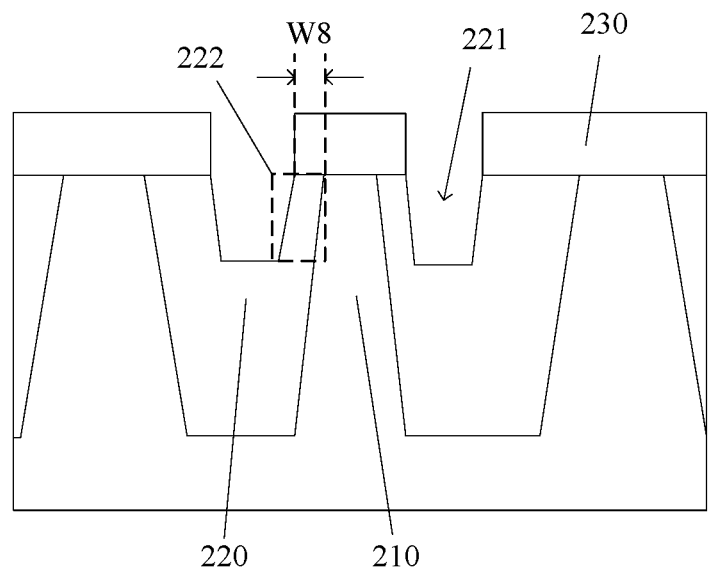

Referring to FIG. 5, a portion of each isolation structure 220 exposed in the corresponding first opening 231 may be removed by a dry etching process using the first photoresist layer 230 as an etch mask and along the corresponding first opening 231. After removing the portion of each isolation structure 220, a first trench 221 may be formed. In the meantime, a residual structure 222 may also be simultaneously formed in each isolation structure 220. Specifically, the residual structure 222 is the portion of the corresponding isolation structure that remains between the corresponding first trench 221 and the active region 210 after the wet etching process. In FIG. 5, the portion of the remaining isolation structure 220 surrounded by a dashed box corresponds to one of the two residual structures 222.

In one embodiment, the dry etching process uses $C_4F_8$ as a main etch gas. Alternatively, the main etch gas may also be $CHF_3$ and any other appropriate gas. In certain other embodiments, the dry etching process may be controlled by adjusting the type of the gas, the ratio of the gas, the bias power, etc.

In one embodiment, the top width W8 of the residual structure 222 may be larger than 0.02 µm. The top width W8 of the residual structures 222 is a key parameter in the present embodiment. Only when the residual structures 222 exist and the top width W8 of the residual structures 222 reaches a desired value, subsequent processes may then be able to be performed.

In one embodiment, the top width of the isolation structure 220 takes the minimum value, i.e. 0.20 µm, the depth of the subsequently-formed first trenches takes a maximum value of 2200 Å, while the angle between each of the sidewalls of the active region 210 and the surface of the semiconductor surface is 85°. According to trigonometric function, the top width W8 of the residual structures 222 may be 2200 Å×cot(85°)=0.02 µm. The top width W8 of the residual structures 222 may need to be larger than the value obtained above, that is, the top width W8 of the residual structures 222 may need to be larger than 0.02 µm.

Figure 6:
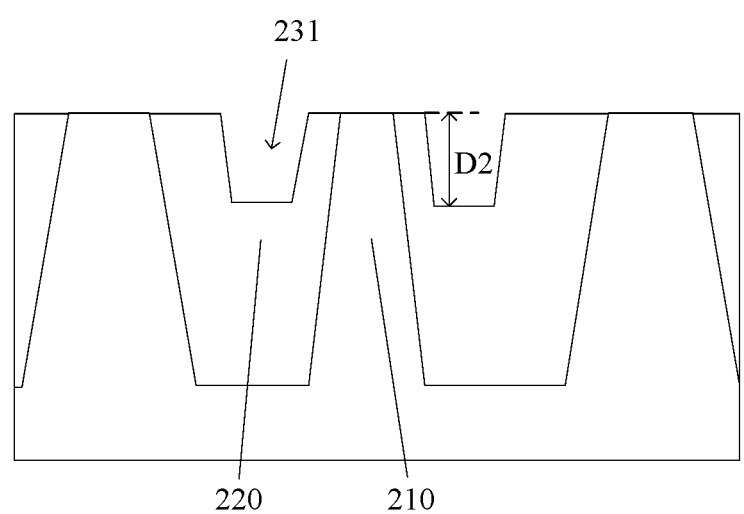

Returning to FIG. 11, further, the first photoresist layer may be removed (S205). FIG. 6 shows a schematic cross-section view of the corresponding semiconductor structure.

Referring to FIG. 6, the first photoresist layer 230 may be removed after forming the first trenches 222 (referring to FIG. 5). The first photoresist layer 230 may be removed by an ashing process followed by a solution cleaning process.

In one embodiment, the depth D2 of the first trenches 221 may need to be at least 40% of the depth D3 of ultimately formed second trenches 223 (referring to FIG. 8) in order to save the etching time for a subsequently performed wet etching process and also ensure that the first trenches 221 can improve the depth to width ratio of the second trenches 223.

Figure 7:
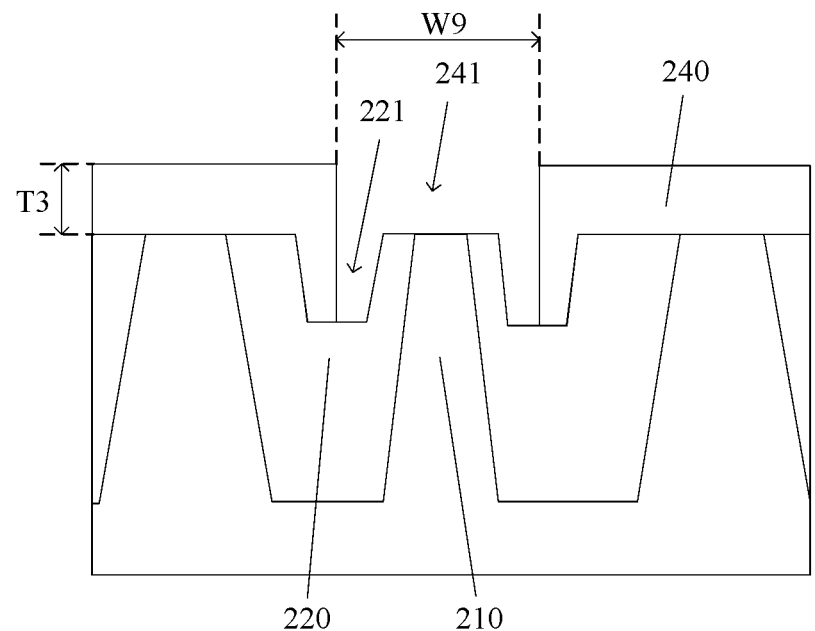

Further, returning to FIG. 11, a second photoresist layer with a second opening may be formed on the active region and the isolation structures (S206). FIG. 7 shows a schematic cross-section view of the corresponding structure.

Referring to FIG. 7, a second photoresist layer 240 may be formed on the active region 210 and the two isolation structures 220. The second photoresist layer 240 may be initially formed to fill the first trenches 221. Further, a second opening 241 may be formed in the second photoresist layer 240. The second opening 241 may expose the top of the active region 210 and the top of each residual structure 222. In addition, the second opening 241 may also expose a portion of each first trench 221.

The thickness T3 of the second photoresist layer 240 may be in a range of 3620 Å to 6700 Å. The actual thickness T3 of the second photoresist layer 240 may vary depending on the type of the mask aligner or the exposure system, the type of the photoresist material, the width of the subsequently-formed second opening 241, and the depth D3 of subsequently-formed second trenches 223 (referring to FIG. 8).

The width W9 of the second opening 241 may be in a range of 0.507 µm to 1.828 µm. The width W9 of the second opening 241 may not only need to ensure that the top of the residual structures 222 and the top of the active region 210 can be completely exposed in the second opening 241, but also need to ensure that at least a portion of the first trenches initially filled by the second photoresist layer 240 can be exposed in in the second opening 241.

Figure 8:
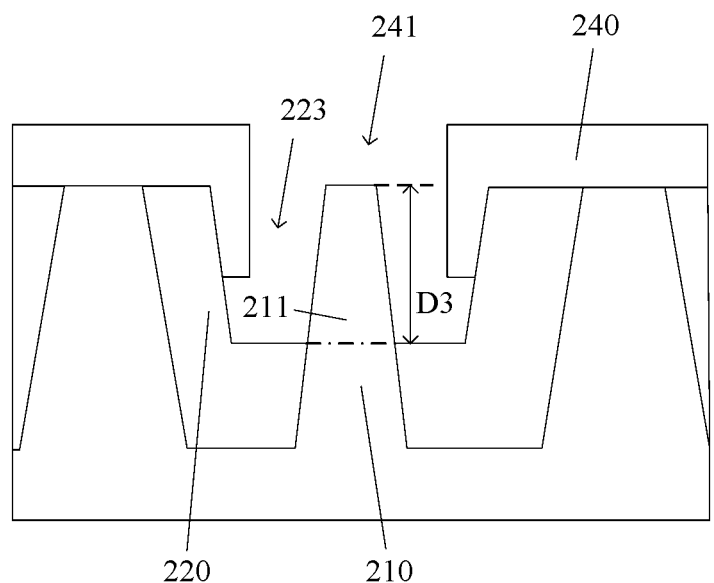

Further, returning to FIG. 11, a second trench may be formed in each of the isolation structures through a wet etching process using the second photoresist layer as an etch mask to remove a portion of the isolation structure along the corresponding second opening (S207). FIG. 8 shows a schematic cross-section view of the corresponding semiconductor structure.

Referring to FIG. 8, a portion of each isolation structure 220 exposed in the corresponding second opening 241 may be removed by a wet etching process using the second photoresist layer 240 as an etch mask and along the corresponding second opening 241. As the wet etching process is completed, a second trench 223 may be formed on each side of the active region 210. In the meantime, a fin structure 211 may also be simultaneously formed. Specifically, the fin structure 211 may be the portion of the active region 210 exposed by the two second trenches after the wet etching process. In FIG. 8 and FIG. 9, a dash-dotted line is used to schematically separate the fin structure 211 from the active region 210.

In one embodiment, the wet etching process uses a BOE solution. In certain other embodiments, the wet etching process may also be performed in a HF solution with a relatively slow etch rate.

In one embodiment, the wet etching process may need to ensure complete removal of the residual structures 222 (referring to FIG. 5) located on the sidewalls of the active region 210. Usually, there will be 100% of over-etching amount during the wet etching process. Therefore, after the wet etching process, the depth of the obtained second trenches 223 may be larger than the depth of the first trenches 221 while the width of the obtained second trenches 223 may also be larger than the width of the first trenches 221. Specifically, the depth of the second trenches 223 may be in a range of 440 Å to 2200 Å.

In one embodiment, the two second trenches 223 and the fin structure 211 may be simultaneously formed, thus the depth D3 of the trenches 223 may be equal to the height of the fin structure 211.

Further, returning to FIG. 11, the second photoresist layer may be removed, a gate dielectric layer may be formed on the top of the fin structure, and a gate electrode may then be formed by filling the second trenches with a gate material (S208). FIG. 9 shows a schematic cross-section view of the corresponding semiconductor structure.

Referring to FIG. 9, the second photoresist layer 240 is removed. A gate dielectric layer (not shown) may be formed on the surface of the fin structure 211. Further, by using a gate material to fill up the second trenches 121 and cover the gate dielectric layer, a gate electrode 250 may be formed. As such, a complete transistor may be formed. The gate material may be polycrystalline silicon.

In one embodiment, besides the above non-planar (i.e. 3D) transistors, the semiconductor substrate may also have planar transistors formed on other regions of the substrate. That is, the disclosed fabrication method may be used to form chips on which only certain transistors are fabricated in a non-planar structure while most of the other transistors are fabricated in a planar form. In such cases, following the disclosed method, non-planar transistors may be fabricated by tools traditionally used to form planar transistors without introducing extra new advanced tools or advanced fabrication processes. Therefore, the fabrication process may be simplified and the process cost may be reduced.

According to the disclosed fabrication method for 3D transistor, by improving the process method traditionally used for large technology nodes, changing the process parameters of the tools used for large technology nodes, and adjusting the fabrication size of large technology nodes, the disclosed method may be used to fabricate 3D transistors. Specifically, fabricating 3D transistors using the disclosed method may not require any process method for small technology nodes or any corresponding advanced tool. In the meantime, structures such as hard mask may not be required in the disclosed method, thus the fabrication process may be simplified and the process cost may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A 3D transistor, comprising:
a semiconductor substrate;
an active region and two isolation structures formed on the semiconductor substrate, wherein the active region is formed between the two isolation structures, each isolation structure contains a trench, each trench exposing a portion of the active region to form a fin structure on a remaining portion of the active region, wherein a bottom surface of the trench is coplanar with a separation plane between the fin structure and the remaining portion of the active region; and
a gate electrode formed across the fin structure and in the trenches on both sides of the fin structure, wherein the gate electrode is separated from adjacent active regions by the isolation structures and both portions of the gate electrode extruding in the trenches and the fin structure have tapered shapes.

2. The 3D transistor according to claim 1, wherein:
a top width of the active region is in a range of 0.187 μm to 1.1 μm;
an angle between each sidewall of the active region and a surface of the semiconductor substrate is in a range of 85° to 90°; and
a top width of the isolation structures is in a range of 0.2 μm to 0.4 μm.

3. The 3D transistor according to claim 1, wherein:
a depth of the trenches is in a range of 440 Å to 2200 Å.

4. The 3D transistor according to claim 1, wherein:
a portion of the isolation structure is on a sidewall surface of a portion of the fin structure.

5. The 3D transistor according to claim 1, wherein:
the gate electrode has a portion above a top surface of each isolation structure.

6. The 3D transistor according to claim 1, wherein:
each trench has a bottom and a sidewall within the isolation structure.

7. The 3D transistor according to claim 1, wherein:
a depth of the trench equals a height of the fin structure.

8. The 3D transistor according to claim 1, wherein:
the gate electrode covers a bottom of the trench and a portion of a top surface of the trench.

9. The 3D transistor according to claim 1, wherein:
the trench is formed by a two-step etching process, wherein a depth by a first etching of the two-step etching is more than 40% of a depth of the trench.

* * * * *